United States Patent
Cheng et al.

(10) Patent No.: US 9,472,470 B2
(45) Date of Patent: Oct. 18, 2016

(54) METHODS OF FORMING FINFET WITH WIDE UNMERGED SOURCE DRAIN EPI

(71) Applicant: GLOBALFOUNDRIES INC., Grand Cayman (KY)

(72) Inventors: Kangguo Cheng, Schenectady, NY (US); Ali Khakifirooz, Los Altos, CA (US); Alexander Reznicek, Troy, NY (US); Dominic J. Schepis, Wappingers Falls, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/564,323

(22) Filed: Dec. 9, 2014

(65) Prior Publication Data

US 2016/0163826 A1   Jun. 9, 2016

(51) Int. Cl.

| | | |
|---|---|---|
| *H01L 21/84* | (2006.01) | |
| *H01L 29/66* | (2006.01) | |
| *H01L 29/78* | (2006.01) | |
| *H01L 29/08* | (2006.01) | |
| *H01L 29/04* | (2006.01) | |
| *H01L 21/8238* | (2006.01) | |
| *H01L 21/8234* | (2006.01) | |

(52) U.S. Cl.
CPC ..... *H01L 21/845* (2013.01); *H01L 21/823431* (2013.01); *H01L 21/823821* (2013.01); *H01L 29/045* (2013.01); *H01L 29/0847* (2013.01); *H01L 29/66636* (2013.01); *H01L 29/66795* (2013.01); *H01L 29/785* (2013.01); *H01L 29/6681* (2013.01)

(58) Field of Classification Search
None
See application file for complete search history.

(56) References Cited

U.S. PATENT DOCUMENTS

| | | | |
|---|---|---|---|
| 8,264,021 B2 | 9/2012 | Lai et al. | |
| 8,310,013 B2 | 11/2012 | Lin et al. | |
| 8,729,609 B2 | 5/2014 | Johnson et al. | |
| 8,796,093 B1 | 8/2014 | Cheng et al. | |
| RE45,165 E * | 9/2014 | Chen | 257/255 |
| 9,123,744 B1 * | 9/2015 | Liao | H01L 21/0262 |
| 9,166,010 B2 * | 10/2015 | Kelly | H01L 29/0653 |
| 2009/0095980 A1 * | 4/2009 | Yu | H01L 29/66795 257/190 |
| 2011/0068407 A1 * | 3/2011 | Yeh | H01L 21/823807 257/369 |
| 2012/0132989 A1 | 5/2012 | Haensch et al. | |
| 2012/0193712 A1 | 8/2012 | Bryant et al. | |

(Continued)

OTHER PUBLICATIONS

Pending U.S. Appl. No. 14/022,945, filed Sep. 10, 2013, entitled: "A FinFET Device Having a Merged Source Drain Region Under Contact Areas and Unmerged Fins Between Contact Areas, and a Method of Manufacturing Same".

(Continued)

*Primary Examiner* — Michael Jung
(74) *Attorney, Agent, or Firm* — Hoffman Warnick LLC; Yuanmin Cai

(57) ABSTRACT

A method including forming fin spacers on opposite sidewalls of a semiconductor fin made from a semiconductor substrate, forming a dielectric layer in direct contact with the fin spacers such that a top surface of the fin and a top surface of the fin spacers remain exposed, recessing a portion of the fin between the fin spacers, removing the fin spacers to create an opening, and epitaxially growing an unmerged source drain region in the opening, where lateral growth of the unmerged source drain region is constrained on opposite sides by the dielectric layer.

14 Claims, 10 Drawing Sheets

(56) References Cited

U.S. PATENT DOCUMENTS

| | | | |
|---|---|---|---|
| 2013/0178034 A1* | 7/2013 | Flachowsky | H01L 29/66628 438/300 |
| 2014/0061794 A1 | 3/2014 | Cheng et al. | |
| 2014/0138797 A1 | 5/2014 | Cheng et al. | |
| 2014/0217517 A1 | 8/2014 | Cai et al. | |
| 2015/0200267 A1* | 7/2015 | Ching | H01L 29/6656 257/401 |
| 2015/0255604 A1* | 9/2015 | Yang | H01L 29/7848 257/192 |

OTHER PUBLICATIONS

Pending U.S. Appl. No. 14/278,674, filed May 15, 2014, entitled: "High Density FinFET Devices With Unmerged Fins".

* cited by examiner

Section A-A**

Section B-B**

Section A-A

Section B-B

Section A-A

Section B-B

Section A-A**

Section B-B**

Section A-A

Section B-B

US 9,472,470 B2

METHODS OF FORMING FINFET WITH WIDE UNMERGED SOURCE DRAIN EPI

BACKGROUND

The present invention generally relates to semiconductor manufacturing, and more particularly to fin field effect transistor devices (FinFET) having a wide unmerged epitaxially grown source drain region.

Complementary Metal-oxide-semiconductor (CMOS) technology is commonly used for fabricating field effect transistors (FET) as part of advanced integrated circuits (IC), such as CPUs, memory, storage devices, and the like. Most common among these may be metal-oxide-semiconductor field effect transistors (MOSFET), in which a gate structure may be energized to create an electric field in an underlying channel region of a substrate, by which charge carriers are allowed to travel through the channel region between a source region and a drain region of the substrate. As ICs continue to scale downward in size, fin field effect transistors (FinFETs), sometimes referred to as tri-gate structures, may be potential candidates for 32 nm node technology and beyond primarily because FinFETs may offer better performance than planar FETs at the same power budget. FinFETs are three dimensional (3D), fully depleted MOSFET devices having a fin structure formed from the substrate material. The gate structure may wrap a portion of the fin acting as the channel region. The portion of the fin not covered by the gate structure may define the source drain region of the semiconductor device.

SUMMARY

According to one embodiment of the present invention, a method is provided. The method may include forming a fin on a semiconductor substrate, forming a shallow trench isolation layer directly on top of the substrate adjacent to the fin, forming a dummy gate directly on top of the shallow trench isolation layer, the dummy gate oriented perpendicular to and directly covering a first portion of the fin, forming dummy gate spacers on opposite sidewalls of the dummy gate, forming fin spacers on opposite sidewalls of a second portion of the fin, forming a dielectric layer directly on top of the shallow trench isolation layer and in contact with the fin spacers, a top surface of the dielectric layer is at or below a top surface of the fin, recessing the second portion of the fin between the fin spacers down to or below a top surface of the shallow trench isolation layer to form a first opening, removing the fin spacers selective to the dielectric layer to expand the first opening and to form a second opening between adjacent portions of the dielectric layer, and forming an unmerged source drain region in the second opening by epitaxially growing a semiconductor material from an exposed surface of a remaining portion of the fin at or near a bottom of the second opening, where lateral growth of the semiconductor material is constrained by the dielectric layer.

According to another embodiment of the present invention, a method is provided. A method may include forming fin spacers on opposite sidewalls of a semiconductor fin made from a semiconductor substrate, forming a dielectric layer in direct contact with the fin spacers such that a top surface of the fin and a top surface of the fin spacers remain exposed, recessing a portion of the fin between the fin spacers, removing the fin spacers to create an opening, and epitaxially growing an unmerged source drain region in the opening, wherein lateral growth of the unmerged source drain region is constrained on opposite sides by the dielectric layer.

According to another embodiment of the present invention, a structure is provided. A structure may include an epitaxially grown unmerged source drain region above and in direct contact with a fin of a semiconductor substrate, the unmerged source drain region comprising a lower portion and an upper portion, a cross-section of the lower portion having a height equal to or greater than a width and a cross-section of the upper portion being substantially diamond shaped, an intersection between the lower portion and the upper portion being substantially flush with a top surface of the fin directly below a gate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
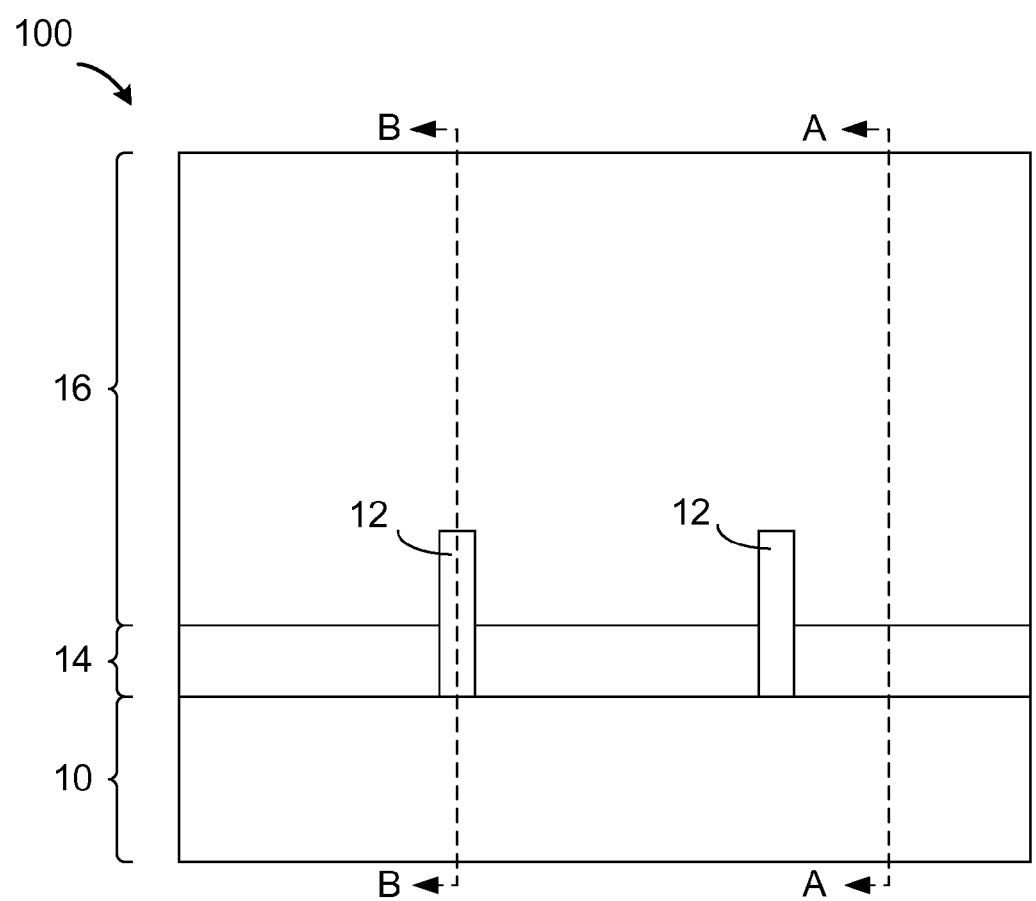
FIG. 1 is a cross-sectional view of a semiconductor structure depicting a plurality of fins, a shallow trench isolation, and a gate, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A FinFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of device spacers on opposite sides of the gate. It should be noted that the invention disclosed below may be fabricated using either a replacement gate or gate last process flow, or a gate first process flow. A replacement gate process flow will be relied on for the description provided below.

In a replacement gate (RG) fabrication approach, a semiconductor substrate may be patterned and etched to form fins. Next, a dummy gate may be formed in a direction perpendicular to the length of the fins. For example, the dummy gate may be pattered and etched from a polysilicon layer. A pair of device spacers can be disposed on opposite sidewalls of the dummy gate. The dummy gates and the pair of device spacers may then be surrounded by an inter-level dielectric. Later, the dummy gate may be removed from between the pair of device spacers, as by, for example, an anisotropic vertical etch process such as a reactive ion etch (RIE). This creates an opening between the pair of device spacers where a metal gate may then be formed between the pair of device spacers. Optionally, a gate dielectric may be configured below the metal gate.

The present invention generally relates to semiconductor manufacturing, and more particularly to fin field effect transistor devices (FinFET) having a wide unmerged epitaxially grown source drain region. One way to fabricate wide unmerged epitaxially grown source drain region may include adding a spacer to opposite sidewalls of the fins and subsequently epitaxially growing the wide source drain region in an opening formed by recessing the fins and removing the spacer. One method of forming a fin field effect transistor devices (FinFET) having wide unmerged epitaxially grown source drain regions is described in detail below by referring to the accompanying drawings in FIGS. 1-15, in accordance with an illustrative embodiment.

Figure 2:
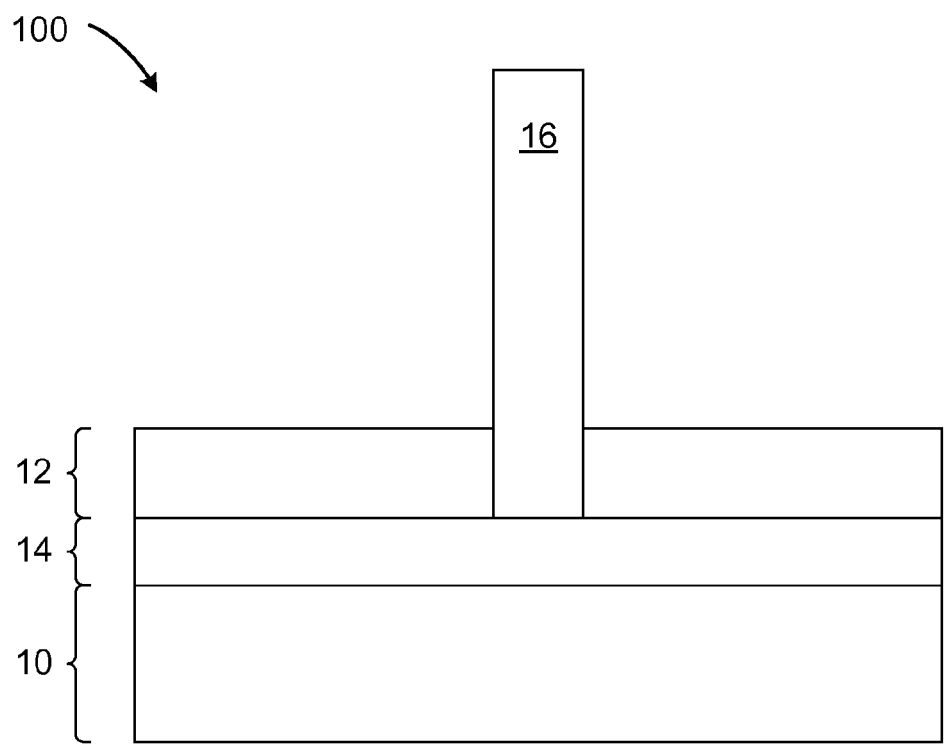
FIG. 2 is a cross-sectional view of the semiconductor structure along section line A-A, according to FIG. 1.
Figure 3:
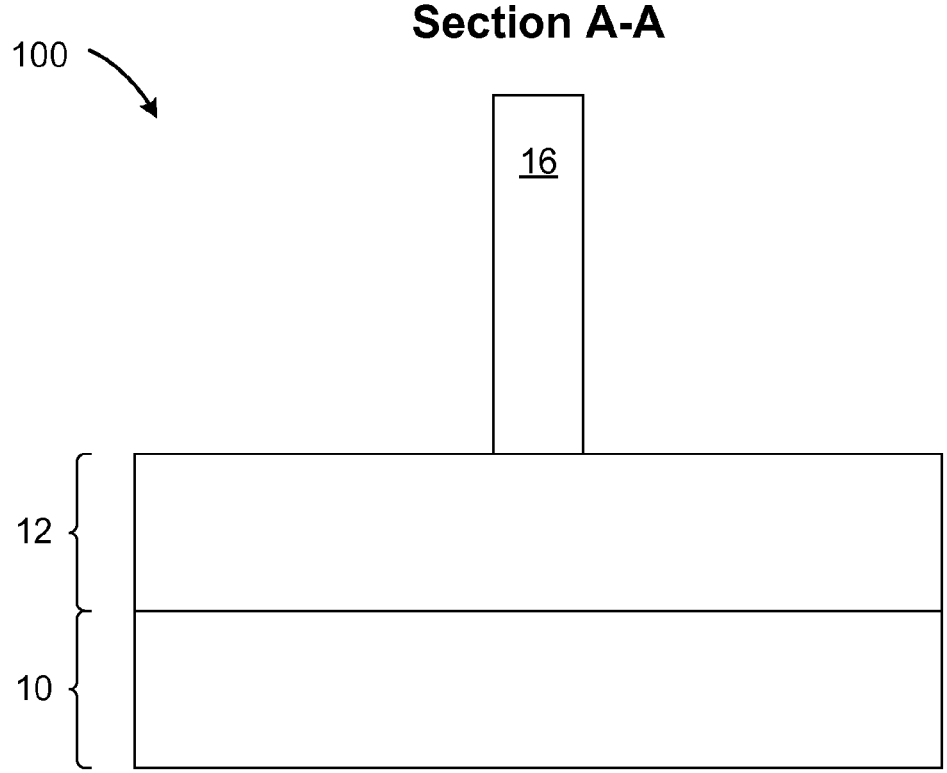
FIG. 3 is an cross-sectional view of the semiconductor structure along section line B-B, according to FIG. 1.

Referring now to FIGS. 1, 2 and 3, a FinFET semiconductor structure 100 (hereinafter "structure") is shown according to one exemplary embodiment. The structure 100 may include a substrate 10, a fin structure 12 (hereinafter "fin"), a shallow trench isolation 14 (hereinafter "STI"), and a dummy gate structure 16 (hereinafter "dummy gate").

The structure 100 may be formed or provided. At this step of the manufacturing process, the fin 12 may be formed from the substrate 10 according to techniques known in the art. The substrate 10 may be a bulk substrate (as shown in FIG. 1), which may be made from any of several known semiconductor material such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. In other embodiments, the substrate 10 may be, for example, a semiconductor-on-insulator (SOI) substrate, where a buried insulator layer separates a base substrate from a top semiconductor layer. In such cases, components of the structure 100, including the fin 12, may be formed in or from the top semiconductor layer of the SOI substrate.

The fin 12 may be formed from the substrate 10 using known photolithography and etch processes. In an exemplary embodiment, the fin 12 may be formed using a sidewall image transfer (SIT) technique. In an embodiment in which the fin 12 may be formed from a bulk semiconductor substrate, the fin 12 may be isolated from one another by regions of dielectric material such as, for example, the STI 14. The STI 14 may be formed using known deposition and patterning techniques. It should be noted that, while the embodiment depicted in the figures includes two fins 12, any number of fins may be formed from the substrate 10.

The dummy gate 16 may be formed over a portion of the fin 12 in structure 100. The portion of the fin 12 covered by the dummy gate 16 may be referred to as a channel region. A blanket layer of a sacrificial material may first be deposited above the structure 100. The sacrificial layer may include any suitable silicon or polysilicon able to be selectively removed. In one embodiment, the sacrificial layer may include amorphous silicon. The sacrificial layer may be deposited using typical deposition techniques, for example, atomic layer deposition (ALD), molecular layer deposition (MLD), chemical vapor deposition (CVD), physical vapor deposition (PVD), and spin on techniques. In one embodiment, the sacrificial layer may have a vertical thickness, or height, above the STI 14 ranging from about 80 nm to about 150 nm, and ranges there between. It should be noted that the vertical thickness of the sacrificial layer may correspond to the height of the dummy gate 16, which may be subsequently patterned form the sacrificial layer. In some embodiments, a thin layer of dummy oxide (not shown) may be deposited prior to depositing the sacrificial layer.

In one embodiment, a cap layer (not shown) may alternatively be fabricated atop the blanket layer. The cap layer may include any dielectric material known in the art, for example, a nitride. In an embodiment, the cap layer may include a hardmask which may subsequently be used to pattern the dummy gate 16. The cap layer may also be deposited using typical deposition techniques, for example, atomic layer deposition (ALD), molecular layer deposition (MLD), chemical vapor deposition (CVD), physical vapor deposition (PVD), and spin on techniques. In one embodiment, the cap layer may include silicon nitride (Si3N4) deposited using a chemical vapor deposition technique. In one embodiment, the cap layer may have a thickness ranging from about 10 nm to about 50 nm and ranges there between, although a thickness less than 10 nm and greater than 50 nm may be acceptable. The dummy gate 16 may then be patterned from the blanket layer by any lithography technique known in the art. It should be noted that the area of the structure 100 covered by the dummy gate 16 may generally be referred to as a gate region, and the areas of the structure 100 not covered by the dummy gate 16 may generally be referred to as a source drain region. It should be noted that, while the embodiment depicted in the figure includes one dummy gate 16, any number of dummy gates may be formed on the structure 100.

Figure 4:
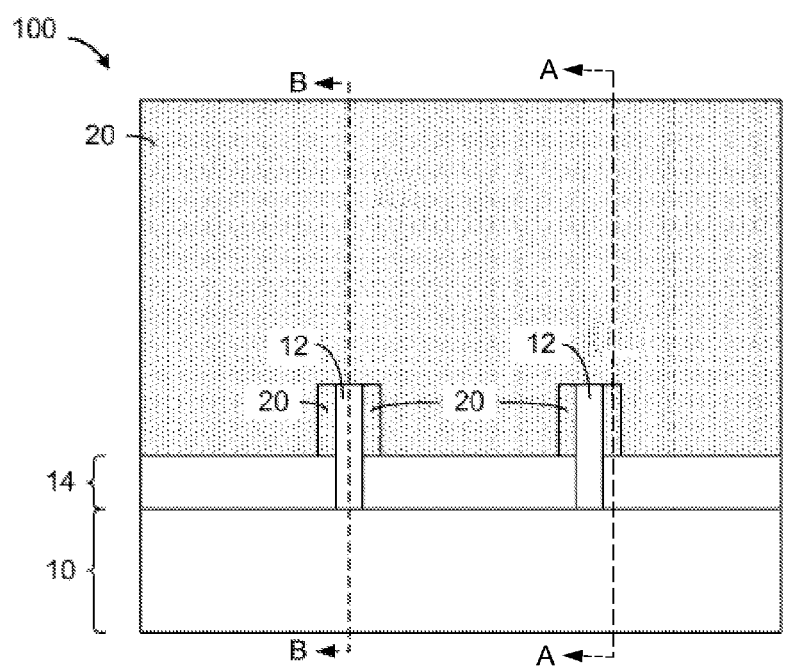
FIG. 4 is a cross-sectional view of the semiconductor structure depicting the formation of a spacer material.
Figure 5:
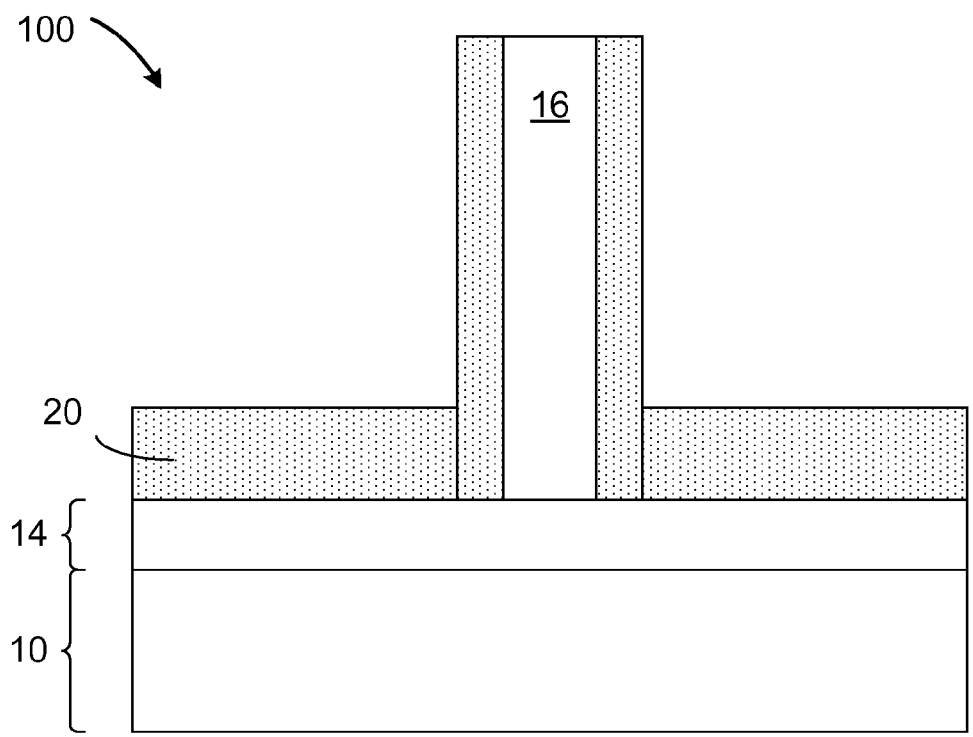
FIG. 5 is a cross-sectional view of the semiconductor structure along section line A-A view of the semiconductor structure, according to FIG. 4.
Figure 6:
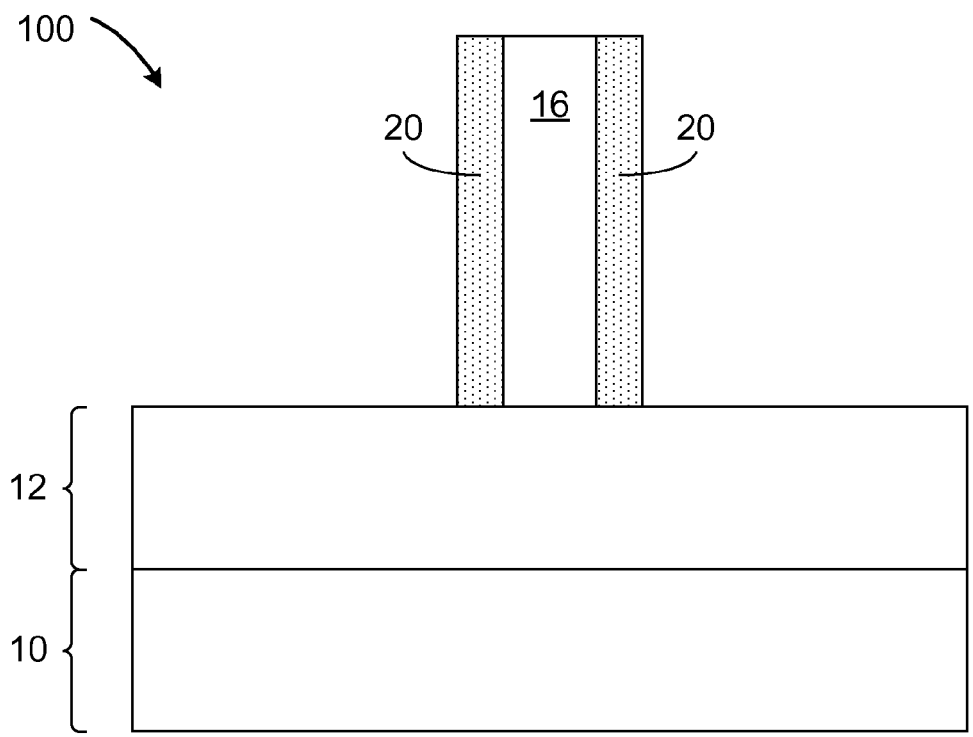
FIG. 6 is a cross-sectional view of the semiconductor structure along section line B-B view, according to FIG. 4.

Referring now to FIGS. 4, 5 and 6, a spacer material 20 (hereinafter "spacer") may be formed on opposite sidewalls of both the dummy gate 16 and the fin 12 in structure 100, according to an exemplary embodiment. The spacer 20 may be formed by conformally depositing or growing a dielectric, followed by an anisotropic etch that removes the dielectric from the horizontal surfaces of the structure 100, while leaving it on the sidewalls of both the dummy gate 16 and the fin 12. In one embodiment, the spacer 20 may include any dielectric material such as silicon nitride. The spacer 20 may include a single layer; however, the spacer 20 may include multiple layers of dielectric material. A portion of the spacer 20 on opposite sidewalls of the dummy gate 16 may be referred to as dummy gate spacers, and a portion of the spacer 20 on opposite sidewalls of the fin 12 may be referred to as fin spacers. It should be noted that the dummy gate spacers may serve a different purpose from the fin spacers. More specifically, the dummy gate spacers may serve to insulate the gate from subsequently formed source drain regions while the fin spacers may be sacrificial and serve as a physical spacer used to create a desired pattern or opening as described in more detail below.

Figure 7:
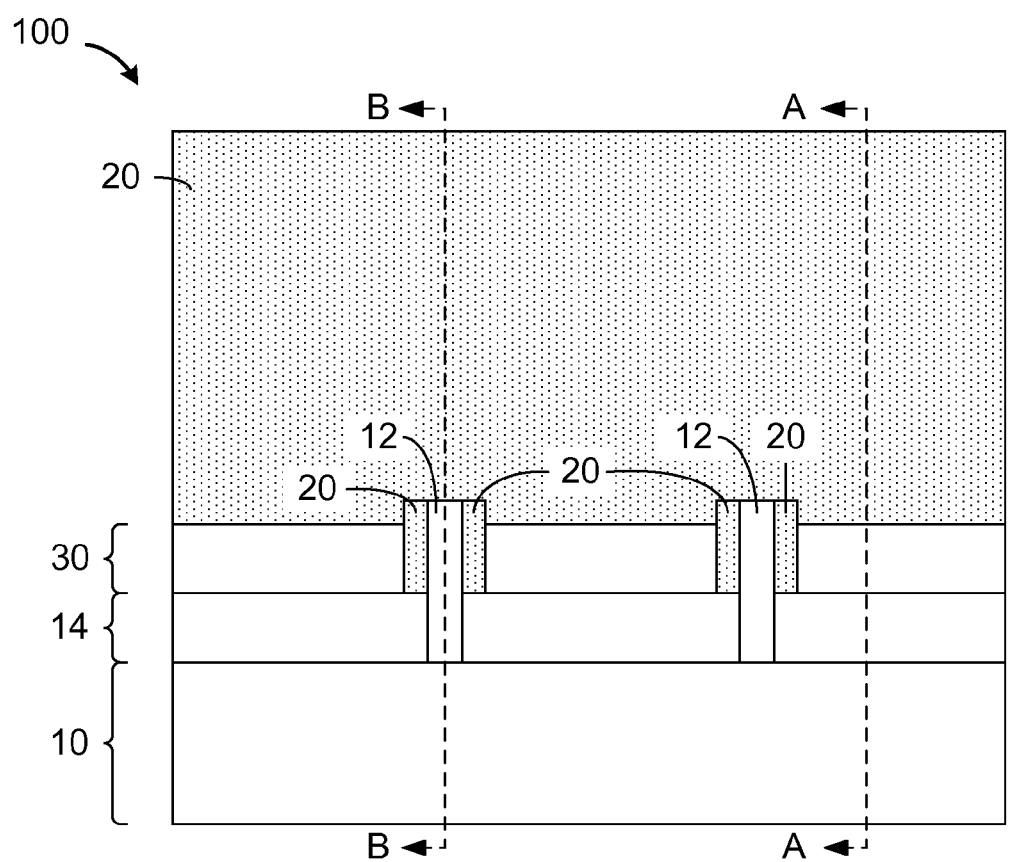
FIG. 7 is a cross-sectional view of the semiconductor structure depicting the formation of a second dielectric.
Figure 8:
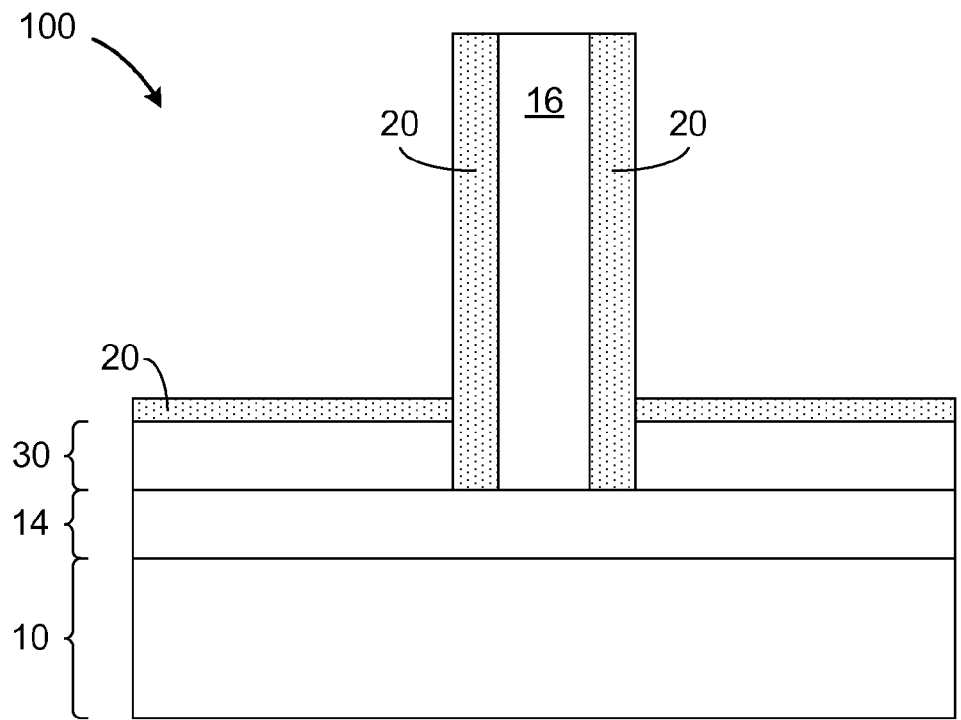
FIG. 8 is a cross-sectional view of the semiconductor structure along section line A-A view, according to FIG. 7.
Figure 9:
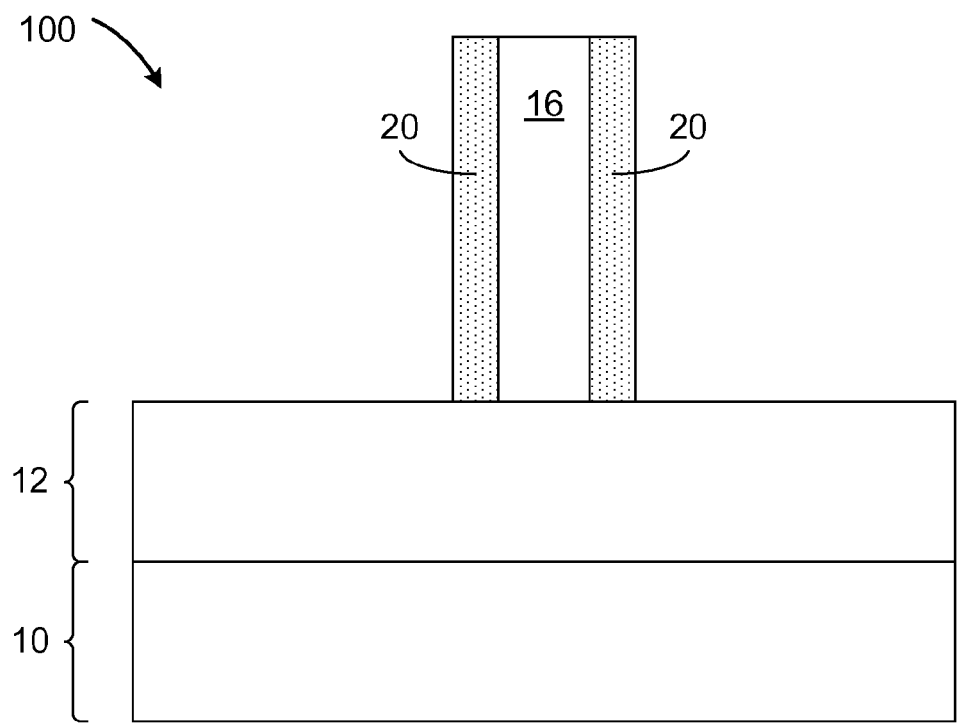
FIG. 9 is a cross-sectional view of the semiconductor structure along section line B-B view, according to FIG. 7.

Referring now to FIGS. 7, 8 and 9, a dielectric layer 30 may be formed directly on the exposed top surfaces of the STI 14, adjacent to the spacer 20 according to an exemplary embodiment. The dielectric layer 30 may be made from an insulator material such as an oxide, nitride, oxynitride, silicon carbon oxynitride, silicon boron oxynitride, low-k dielectric, or any combination thereof. The dielectric layer 30 may be deposited using typical deposition techniques, for example, atomic layer deposition (ALD), molecular layer deposition (MLD), chemical vapor deposition (CVD), physical vapor deposition (PVD), and spin on techniques. In all cases, the dielectric layer 30 may consist of a material different than the material used in the spacer 20. In an embodiment, for example, the spacer 20 may preferably have a different etch rate than dielectric layer 30, to facilitate the selective removal of one with respect to the other. More specifically, the materials of the spacer 20 and the dielectric layer 30 may be specifically chosen to facilitate the selective removal of the spacer 20 selective to the dielectric layer 30. In an embodiment, the dielectric layer 30 may be made from a nitride using a chemical vapor deposition technique. In a preferred embodiment, the spacer 20 is a nitride and the dielectric layer 30 would be an oxide, such as, for example SiO2, so that the spacer 20 can be removed selectively to the dielectric layer 30. Alternatively, the spacer 20 can be an oxide and the dielectric layer 30 could be a nitride. Further, in an embodiment, the dielectric layer 30 may include one or more layers.

Figure 10:
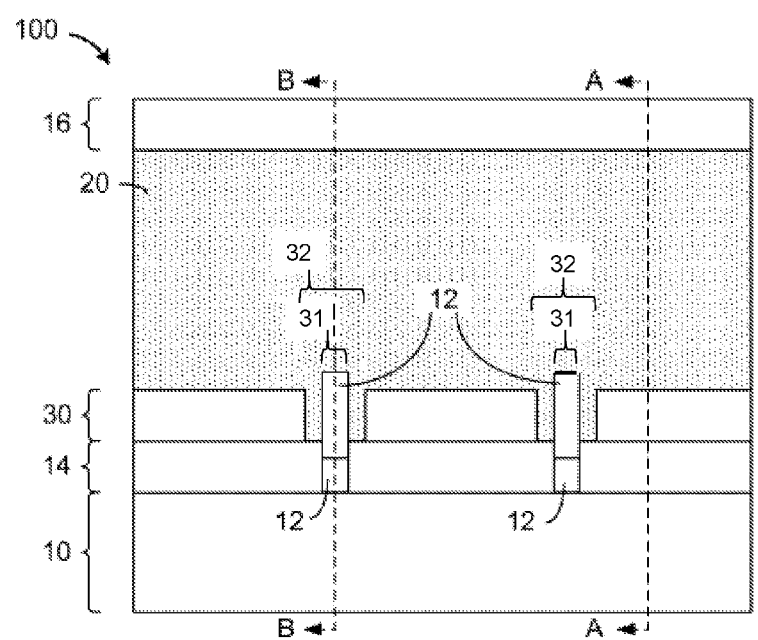
FIG. 10 is a cross-sectional view of the semiconductor structure depicting the partial removal of the spacer material and the fins.
Figure 11:
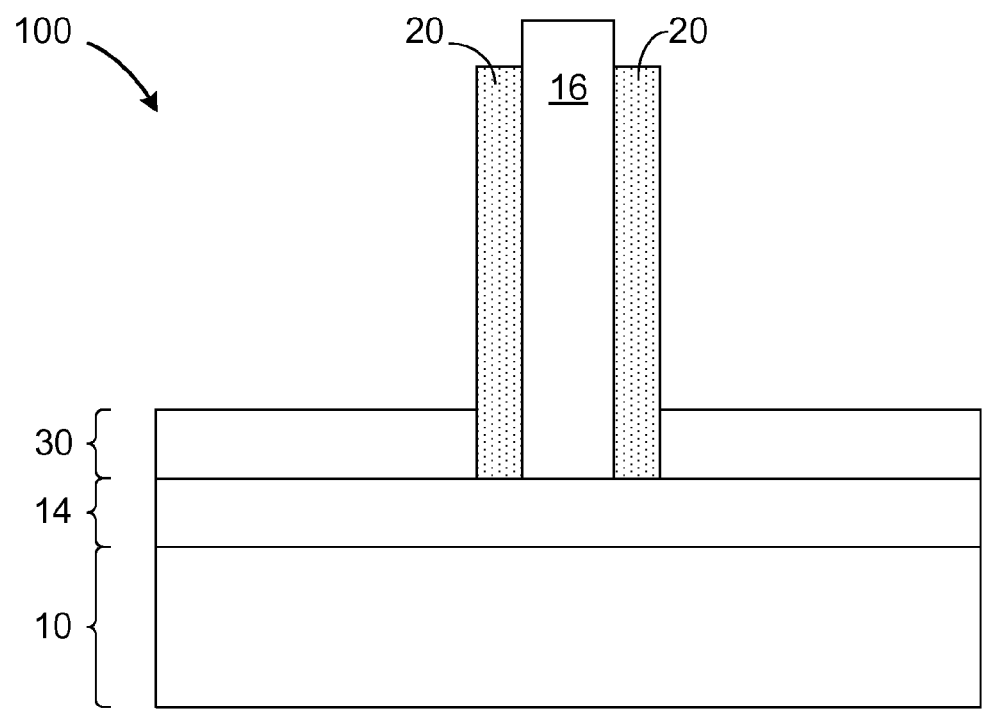
FIG. 11 is a cross-sectional view of the semiconductor structure along section line A-A view, according to FIG. 10.
Figure 12:
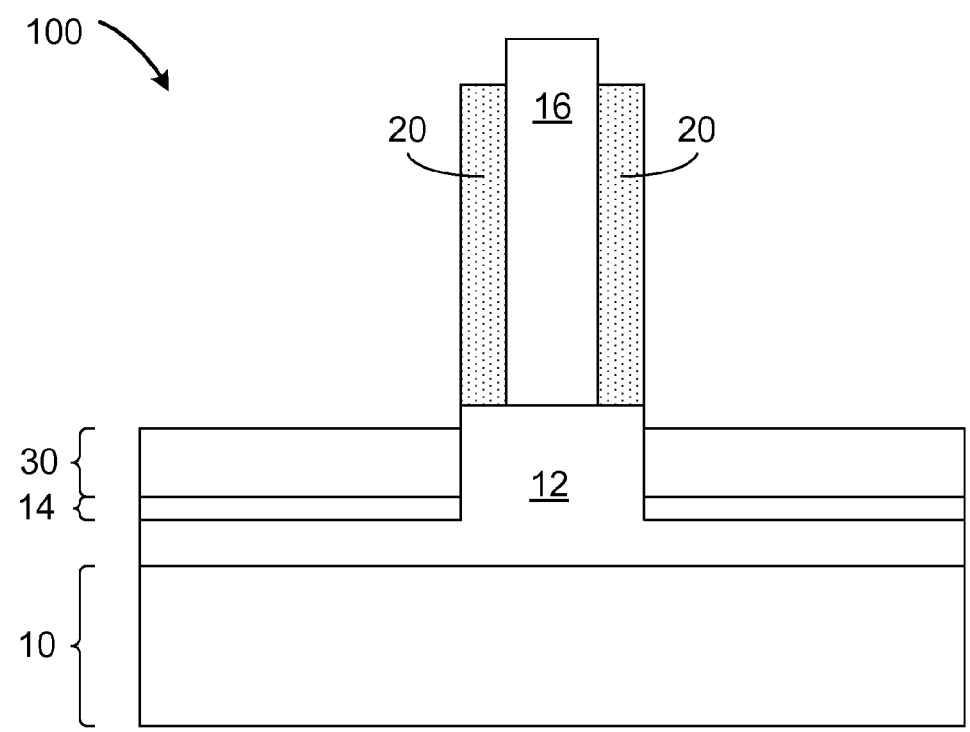
FIG. 12 is a cross-sectional view of the semiconductor structure along section line B-B view, according to FIG. 10.

Referring now to FIGS. 10, 11 and 12, a portion of the fin 12 may be recessed and a portion of the spacer 20, specifically, the fin spacers, may be removed. A portion of the fin 12 may be selectively recessed by means of any etching technique known in the art including, but not limited to, a reactive ion etching (RIE) technique or a wet etch technique. In an embodiment in which the fin 12 includes silicon and the spacer 20 includes a nitride, a fluorine based RIE technique, such as, for example, CH4 or CHF3, may be used to recess the fin 12. Recessing the fin 12 may create a first opening 31 between the fin spacers. The first opening 31 may extend from a top surface of the fin spacers down to a point at or below a top surface of the STI 14. The first opening 31 may have a width about equal to a width of the fin 12. A portion of the fin 12 may remain exposed at a bottom of the first opening 31.

Next, the fin spacers may be removed selective to the dielectric layer 30 and selective to the STI 14. The fin spacers may be selectively removed by means of any etching technique known in the art including, but not limited to, a reactive ion etching (RIE) technique or a wet etch technique. Removal of the fin spacers may effectively enlarge the width of the first opening 31 to create a second opening 32. Exposed sidewalls of the dielectric layer 30 define sidewalls of the second opening 32, while exposed surfaces of both the STI 14 and the remaining portion of the fin 12 define a bottom of the second opening, as illustrated in the figures. The second opening 32 may extend from the top surface of dielectric layer 30 down to a top surface of the recessed portion of the fin 12. In an embodiment, as depicted in the figures, the top surface of the recessed portion of the fin 12 may actually be below a top surface of the STI 14. The second opening 32 may have a width about equal to a width of the fin 12 plus the width of both of the fin spacers. In an embodiment, the width of the second opening 32 may range from about 10 nm to about 30 nm. A portion of the fin 12 may remain exposed at a bottom of the first opening 31. In an embodiment, the spacer 20 width could nominally range from 5 nm to 10 nm and the fin 12 is nominally about 10 nm making the second opening 32 about 20 nm or range from 10 nm to 30 nm.

The second opening 32 may have a first bottom surface and a second bottom surface. The first bottom surface may substantially be at the level of the bottom surface of the STI 14, where the spacer 20 was removed. The second bottom surface may be the top surface of the recessed portion of the fin 12, which may be below at or below the top surface of the STI 14.

Figure 13:
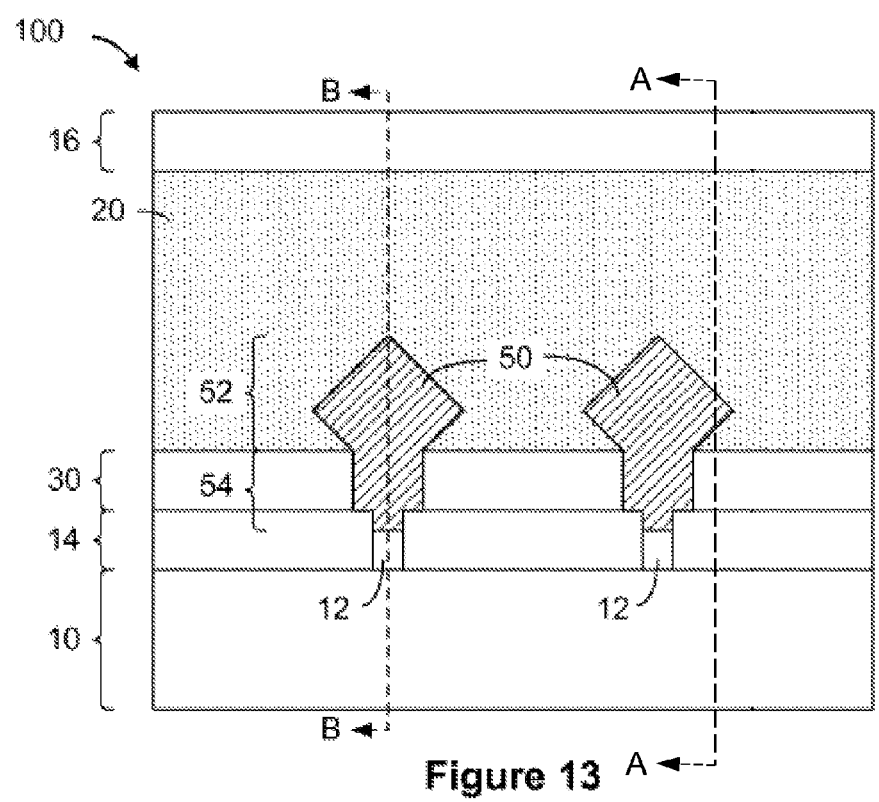
FIG. 13 is a cross-sectional view of the semiconductor structure depicting the epitaxial growth of the wide source drain region.
Figure 14:
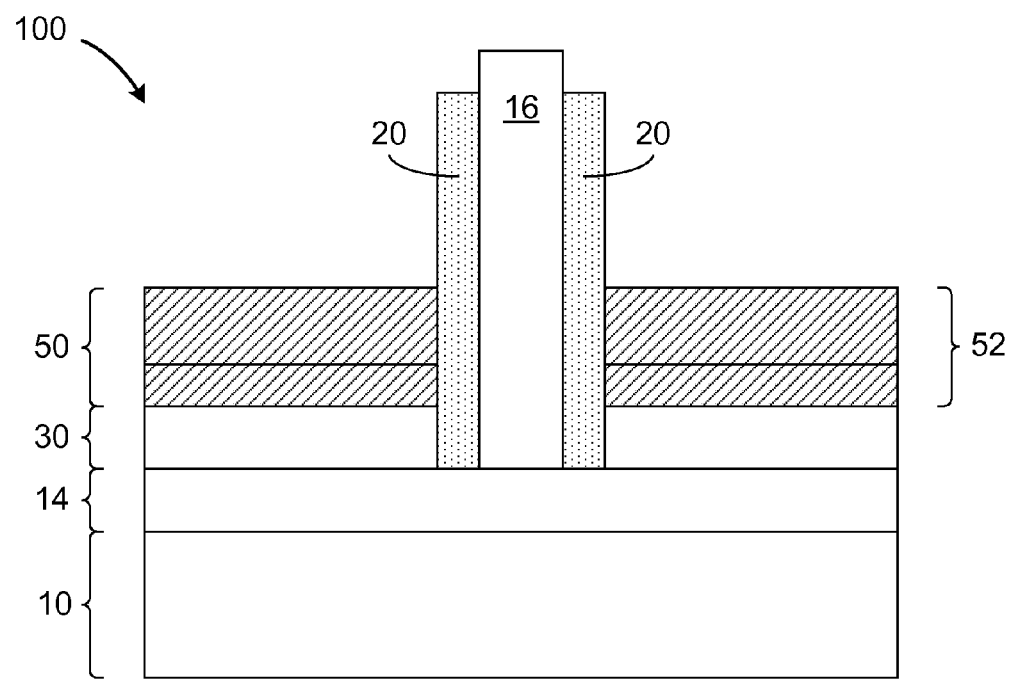
FIG. 14 is a cross-sectional view of the semiconductor structure along section line A-A view, according to FIG. 13.
Figure 15:
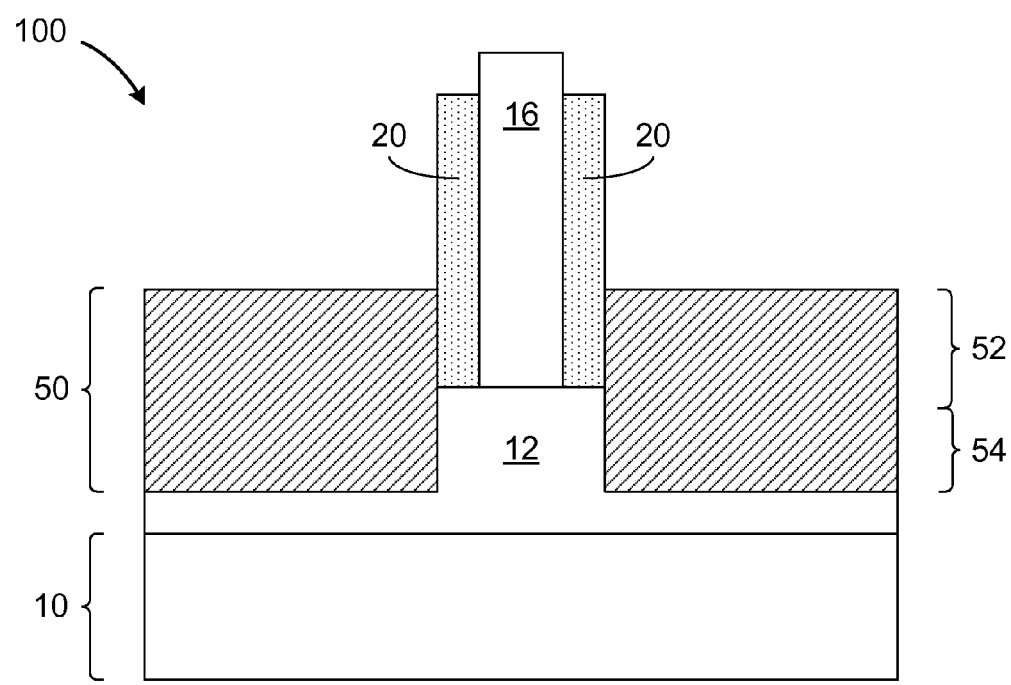
FIG. 15 is a cross-sectional view of the semiconductor structure along section line B-B view, according to FIG. 13.

Referring now to FIGS. 13, 14 and 15, the wide source drain region 50 may be grown directly from an exposed portion of the fin 12 remaining at the bottom of the second opening 32. In such embodiments, the portion of the fin 12 remaining at the bottom of the second opening 32 may serve as a seed layer for growing the wide source drain region 50. The wide source drain region 50 may include any semiconductor material having a dopant concentration according to the characteristics of the structure 100. For example, in one embodiment where the structure 100 is an n-type field effect transistor (n-FET) device, the wide source drain region 50 may include a carbon-doped silicon (Si:C) material, where the atomic concentration of carbon (C) may range from approximately 0.2% to approximately 3.0%. The wide source drain region 50 may be doped by any known n-type dopant use in the fabrication of n-FET devices such as, for instance, phosphorus or arsenic. In one embodiment, the dopant concentration in the wide source drain region 50 may range from approximately $4 \times 10^{20}$ cm$^{-3}$ to approximately $9 \times 10^{20}$ cm$^{-3}$.

For example, in another embodiment where the structure 100 is a p-type field effect transistor (p-FET) device, the wide source drain region 50 may include a silicon germanium (SiGe) material, where the atomic concentration of germanium (Ge) may range from approximately 10% to approximately 80%. The wide source drain region 50 may be doped by any known p-type dopant use in the fabrication of p-FET devices such as, for instance, boron. In one embodiment, the dopant concentration in the wide source drain region 50 may range from approximately $4 \times 10^{20}$ cm$^{-3}$ to approximately $9 \times 10^{20}$ cm$^{-3}$. Examples of various epitaxial growth techniques used in forming the wide source drain region 50 may include, for example, rapid thermal chemical vapor deposition, low energy cluster beam deposition, ultra-high vacuum chemical vapor deposition, and atmospheric pressure chemical vapor deposition.

In an embodiment, the wide source drain region 50 may be described as having a lower portion 54 and an upper portion 52. The lower portion 54 may be substantially bordered on at least two sides by the dielectric layer. The upper portion 52 may extend above the dielectric layer and may have a diamond shaped cross section with a {111} crystallographic orientation. The height of the lower portion 54 may be inversely proportional to a width of the upper portion 52. The adjustment of the height or thickness of the dielectric layer 30 may control the width of the upper portion 52, whereby the width of the upper portion 52 is inversely proportional to the height or thickness of the dielectric layer 30.

As described above, the second opening 32 where epixatial growth occurs includes the first opening where the fin 12 was removed plus the second opening 32 where the fin spacers were removed. The width of the second opening 32 is greater than the width of the fin 12. The width of the second opening 32 allows for greater epitaxy growth than would occur if the second opening 32 was only the width of fin 12. As the epitaxy growth approaches the height of the dielectric layer 30, the volume of epitaxy in the second opening 32 occupies the area where both the fin 12 and the fin spacers were removed. This volume of epitaxy in the second opening 32 is greater than the volume would have been if the second opening 32 was the area of fin 12 without fin spacers, or in other words the first opening. Epitaxial growth may continue until the wide source drain region 50 extend above the dielectric layer 30 as shown in FIGS. 13, 14 and 15. Epitaxial growth in the second opening 32 may generally take place on a {111} plane. The facetted diamond shape observed in a portion of the wide source drain region 50 extending above the dielectric layer 30 may be a consequence of the different growth rates during the epitaxial deposition process inherent to each crystallographic orientation plane of the material forming the wide source drain region 50.

A portion of the source drain region 50 may be geometrically constrained by the dielectric layer 30 such that lateral epitaxial growth, particularly in the {111} plane, may be prevented. This may delay and control epitaxial growth and thus the formation of the facetted diamond shape. As the epitaxial growth of the facetted diamond shape may be delayed, a desired source drain volume may be achieved before adjacent source drain regions merge or touch. The restriction of epitaxial lateral growth during formation of the source drain region 50 may prevent unwanted merging of adjacent source drain regions and thus reduce the risk of an electrical short in the device. This may allow for optimal fin spacing and device density, reducing the amount of layout constraints in the structure 100 that may be dictated by the size of the lateral epitaxial growth. Therefore, by adding fin spacers to opposite sidewalls of the fins and subsequently epitaxially growing wide source drain regions in an opening formed by recessing the fins and removing the fin spacers epitaxial source drain regions may be formed with constrained lateral epitaxial growth.

The resulting wide source drain region 50 may maximize epitaxial volume without merging of source drain regions. Larger volume source drain regions may yield a larger surface area providing lower resistance and greater contact area for dopant implantation; however fabrication of larger volume source drain regions typically results in adjacent source drain regions growing into each other and merging. Unmerged wide source drain regions may improve device performance via increased channel strain and increased source and drain doping. The volume of unmerge source drain regions is typically limited in order to prevent merging. Therefore, fabricating source drain regions having a relatively large volume without merging was not possible. Fabrication of wide unmerged source drain regions will allow for increased device density and future fabrication of advanced semiconductor devices. This method may allow for the formation of large volume, unmerged, source drain regions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a fin on a semiconductor substrate;
    forming a shallow trench isolation layer directly on top of the substrate adjacent to the fin;
    forming a dummy gate directly on top of the shallow trench isolation layer, the dummy gate oriented perpendicular to and directly covering a first portion of the fin;
    forming dummy gate spacers on opposite sidewalls of the dummy gate, and forming fin spacers on opposite sidewalls of a second portion of the fin;

forming a dielectric layer directly on top of the shallow trench isolation layer and in contact with the fin spacers, a top surface of the dielectric layer is at or below a top surface of the fin;

recessing the second portion of the fin between the fin spacers down to or below a top surface of the shallow trench isolation layer to form a first opening;

removing the fin spacers selective to the dielectric layer to expand the first opening and to form a second opening between adjacent portions of the dielectric layer; and forming an unmerged source drain region in the second opening by epitaxially growing a semiconductor material from an exposed surface of a remaining portion of the fin at or near a bottom of the second opening, wherein lateral growth of the semiconductor material is constrained by the dielectric layer.

2. The method of claim 1, wherein forming the unmerged source drain region in the second opening comprises:

epitaxially growing the semiconductor material above the dielectric layer such that the unmerged source drain region comprises a lower portion and an upper portion, the lower portion being substantially bordered on at least two sides by the dielectric layer and the upper portion extending above the dielectric layer.

3. The method of claim 1, wherein forming the unmerged source drain region in the second opening comprises:

epitaxially growing the semiconductor material above the dielectric later such that a portion of the unmerged source drain region above the dielectric layer comprises substantially diamond shaped cross-section.

4. The method of claim 1, wherein forming the unmerged source drain region in the second opening comprises:

epitaxially growing the semiconductor material above the dielectric layer such that a portion of the unmerged source drain region above the dielectric layer comprises a $\{111\}$ crystallographic orientation.

5. The method of claim 1, wherein the fin spacers comprise a nitride and the dielectric layer comprises an oxide, and fluorine based reactive ion etching technique is used to remove the fin spacers.

6. The method of claim 1, wherein forming the dummy gate spacers and the fin spacers comprises:

depositing a conformal dielectric layer on the dummy gate and the fin; and removing a portion of the conformal dielectric layer from a top surface of the dummy gate and a top surface of the fin using an anisotropic etching technique.

7. The method of claim 1, further comprising:
controlling a width of the second opening by controlling a width of the fin spacers.

8. The method of claim 1, further comprising:
controlling a width of a portion of the semiconductor material above the dielectric layer by adjusting a height or thickness of the dielectric layer, whereby the width of the portion of the semiconductor material above the dielectric layer is inversely proportional to the height or thickness of the dielectric layer.

9. A method comprising:

forming fin spacers on opposite sidewalls of a semiconductor fin made from a semiconductor substrate;

forming a dielectric layer in direct contact with the fin spacers such that a top surface of the semiconductor fin and a top surface of the fin spacers remain exposed;

recessing a portion of the semiconductor fin between the fin spacers, and removing the fin spacers to create an opening; and epitaxially growing an unmerged source drain region in the opening, wherein lateral growth of the unmerged source drain region is constrained on opposite sides by the dielectric layer, and wherein the epitaxially growing the unmerged source drain region in the opening includes epitaxially growing a semiconductor material above the dielectric layer such that a portion of the unmerged source drain region above the dielectric layer includes a substantially diamond shaped cross-section.

10. The method of claim 9, wherein epitaxially growing the unmerged source drain region in the opening comprises:

epitaxially growing a semiconductor material from an exposed surface of a remaining portion of the semiconductor fin at or near a bottom of the opening, and the unmerged source drain region extending above the dielectric layer.

11. The method of claim 9, epitaxially growing the unmerged source drain region in the opening comprises:

epitaxially growing a semiconductor material above the dielectric layer such that a portion of the unmerged source drain region above the dielectric layer comprises a $\{111\}$ crystallographic orientation.

12. The method of claim 9, wherein the fin spacers comprise a nitride and the dielectric layer comprises an oxide, and a fluorine based reactive ion etching technique is used to remove the fin spacers.

13. The method of claim 9, wherein forming the fin spacers comprises:

depositing a conformal dielectric layer on the fin; and removing a portion of the conformal dielectric layer from a top surface of the semiconductor fin using an anisotropic etching technique.

14. The method of claim 9, further comprising:
controlling a width of the opening by controlling a width of the fin spacers.

\* \* \* \* \*